(12) United States Patent
Ni et al.

(10) Patent No.: US 11,335,745 B2
(45) Date of Patent: May 17, 2022

(54) DISPLAY PANEL COMPRISING BLOCKING STRUCTURE DISPOSED BETWEEN DISPLAY REGION AND BENDING REGION

(71) Applicant: Wuhan China Star Optoelectronics Semiconductor Display Technology Co., Ltd., Wuhan (CN)

(72) Inventors: Jing Ni, Wuhan (CN); Chinghung Chien, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 198 days.

(21) Appl. No.: 16/649,996

(22) PCT Filed: Aug. 2, 2019

(86) PCT No.: PCT/CN2019/099062
§ 371 (c)(1),
(2) Date: Mar. 24, 2020

(87) PCT Pub. No.: WO2020/237826
PCT Pub. Date: Dec. 3, 2020

(65) Prior Publication Data
US 2021/0408179 A1      Dec. 30, 2021

(30) Foreign Application Priority Data
May 31, 2019   (CN) .......................... 201910472876.9

(51) Int. Cl.
*H01L 27/32*   (2006.01)
*H01L 51/00*   (2006.01)
*H01L 51/52*   (2006.01)

(52) U.S. Cl.
CPC ...... *H01L 27/3246* (2013.01); *H01L 51/0097* (2013.01); *H01L 51/5259* (2013.01)

(58) Field of Classification Search
CPC combination set(s) only.
See application file for complete search history.

(56) References Cited

U.S. PATENT DOCUMENTS

2019/0165312 A1*   5/2019   Bae ...................... H01L 51/5253
2019/0319201 A1*   10/2019  Goh .................... H01L 27/3276
2020/0313102 A1*   10/2020  Kim .................... H01L 27/3258

FOREIGN PATENT DOCUMENTS

| CN | 104393189 | 3/2015 |
| CN | 108874256 | 11/2018 |
| CN | 109003998 | 12/2018 |
| CN | 109166825 | 1/2019 |
| KR | 2015-0124816 | 11/2015 |

* cited by examiner

Primary Examiner — Nduka E Ojeh

(57) ABSTRACT

The present invention provides a display panel, and the display panel includes an array substrate, a drain metal layer disposed on the array substrate, a flat layer disposed on the drain metal layer, and a pixel defining layer and light-emitting device layer disposed on the flat layer. The pixel defining layer includes a first pixel defining layer located in a display region of the display panel, and a second pixel defining layer located in an edge region of a side portion of the display region. A packaging layer is disposed on the first pixel defining layer, and a blocking structure is disposed on the second pixel defining layer.

14 Claims, 5 Drawing Sheets

DISPLAY PANEL COMPRISING BLOCKING STRUCTURE DISPOSED BETWEEN DISPLAY REGION AND BENDING REGION

RELATED APPLICATIONS

This application is a National Phase of PCT Patent Application No. PCT/CN2019/099062 having International filing date of Aug. 2, 2019, which claims the benefit of priority of Chinese Patent Application No. 201910472876.9 filed on May 31, 2019. The contents of the above applications are all incorporated by reference as if fully set forth herein in their entirety.

FIELD AND BACKGROUND OF THE INVENTION

The present invention is related to the field of display technology, and specifically to a display panel.

Organic light-emitting diodes (OLEDs) have received great attention from academia and industry because of their great development potential in solid-state lighting and flat panel display. In OLED display panels, a thin film transistor controls light emission of OLED devices by controlling signals on a flexible substrate. A large number of metal traces that transmit signals are integrated into a lower edge of the panel. During a back-end module process, the metal traces are bent along a bending region, and the metal traces are folded and fixed to a back of the panel.

Because the organic matter and the metal cathode of the OLED film layer are very sensitive to water and oxygen, a packaging layer formed by alternating inorganic and organic film layers is generally used to block water and oxygen from intruding into the device. Distance between the packaging layer and the bending region is short, and the inorganic film layer is easily covered the bending region due to the precision issue of the coating process. In the subsequent bending process, since the inorganic film layer is brittle, cracks are easily generated, and the cracks may further propagate to the display region, thereby causing water and oxygen to intrude channels and damaging the device.

SUMMARY OF THE INVENTION

Since the inorganic film layer is brittle, cracks are easily generated, and the cracks may further propagate to the display region, thereby causing water and oxygen to intrude channels and damaging the device.

A display panel, including:
an array substrate;
a flat layer disposed on the array substrate;
a pixel defining layer disposed on the flat layer, the pixel defining layer including a first pixel defining layer located in a display region of the display panel, and a second pixel defining layer located in an edge region of a side portion of the display region; and
a packaging layer disposed on the first pixel defining layer;
wherein a bending region is disposed in the edge region of the display panel, and a blocking structure is disposed on the second pixel defining layer for blocking the packaging layer from extending to the bending region; and
wherein the array substrate includes:
a flexible substrate;
an active semiconductor layer disposed on the flexible substrate;
a gate insulating layer covering the active semiconductor layer;
a gate metal layer disposed on the gate insulating layer;
an interlayer dielectric layer covering the gate metal layer; and
a drain metal layer disposed on the interlayer dielectric layer, and the flat layer disposed on the drain metal layer.

Further, the bending region is disposed in the edge region of the display panel. The blocking structure includes a first blocking portion disposed between the display region and the bending region, and the first blocking portion contacts the packaging layer.

Further, a whole cross section of the first blocking portion is a strip shape, and the first blocking portion extends along a lengthwise direction of the bending region.

Further, a length of a side of the packaging layer near a side of the first blocking portion is less than or equal to a length of the first blocking portion.

Further, a whole cross section of the first blocking portion is a ring shape, and the first blocking portion is disposed around a circumference of the display region.

Further, the first blocking portion includes a blocking layer disposed on the pixel defining layer.

Further, a longitudinal section of the blocking layer is an inverted trapezoid shape.

Further, the first blocking portion includes a blocking groove disposed on the pixel defining layer.

Further, a longitudinal section of the blocking groove is a square shape or an isosceles trapezoid shape.

Further, the blocking structure includes at least one second blocking portion spaced with the first blocking portion, and the at least one second blocking portion is parallel to the first blocking portion.

A display panel, including:
an array substrate;
a flat layer disposed on the array substrate;
a pixel defining layer disposed on the flat layer, the pixel defining layer including a first pixel defining layer located in a display region of the display panel, and a second pixel defining layer located in an edge region of a side portion of the display region; and
a packaging layer disposed on the first pixel defining layer;
wherein a bending region is disposed in the edge region of the display panel, and a blocking structure is disposed on the second pixel defining layer for blocking the packaging layer from extending to the bending region.

Further, the bending region is disposed in the edge region of the display panel. The blocking structure includes a first blocking portion disposed between the display region and the bending region, and the first blocking portion contacts the packaging layer.

Further, a whole cross section of the first blocking portion is a strip shape, and the first blocking portion extends along a lengthwise direction of the bending region.

Further, a length of a side of the packaging layer near a side of the first blocking portion is less than or equal to a length of the first blocking portion.

Further, a whole cross section of the first blocking portion is a ring shape, and the first blocking portion is disposed around a circumference of the display region.

Further, the first blocking portion includes a blocking layer disposed on the pixel defining layer.

Further, a longitudinal section of the blocking layer is an inverted trapezoid shape.

Further, the first blocking portion includes a blocking groove disposed on the pixel defining layer.

Further, a longitudinal section of the blocking groove is a square shape or an isosceles trapezoid shape.

Further, the blocking structure includes at least one second blocking portion spaced with the first blocking portion, and the at least one second blocking portion is parallel to the first blocking portion.

Cracks are generated at the edge region of the packaging layer during the bending process, even if the packaging layer has extended to the bending region. Because of the first blocking portion disposing between the display region and the bending region, the cracks of the packaging layer have been stopped by an upper boundary of the first blocking portion. The cracks cannot propagate further into the display region, and it effectively blocks water and oxygen intrusion and prevents device damage.

BRIEF DESCRIPTION OF THE SEVERAL VIEWS OF THE DRAWINGS

In order to describe technical solutions in the present invention clearly, drawings to be used in the description of embodiments will be described briefly below. Apparently, drawings described below are only for some embodiments of the present invention, and other drawings may be obtained by those skilled in the art based on these drawings without creative efforts.

Figure 1:
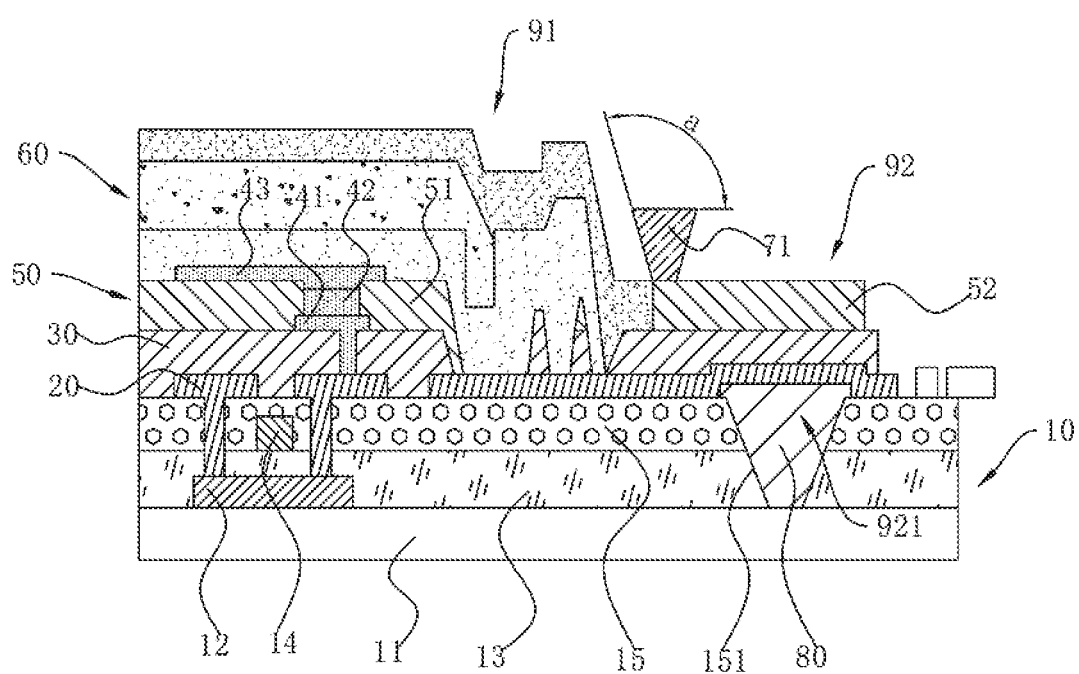
FIG. 1 is a structural diagram of a display panel of the first embodiment of the present invention.

REFERENCE SIGNS array substrate 10; flexible substrate 11; active semiconductor layer 12; gate insulating layer 13; gate metal layer 14; interlayer dielectric layer 15; groove 151; drain metal layer 20; flat layer 30; anode metal layer 41; light-emitting layer 42; hole injection layer 421; hole transport layer 422; light-emitting material layer 423; electron transport layer 424; electron injection layer 425; cathode layer 43; pixel defining layer 50; first pixel defining layer 51; second pixel defining layer 52; packaging layer 60; first inorganic layer 61; organic layer 62; second inorganic layer 63; first blocking portion 71; second blocking portion 72; organic filing layer 80; display region 91; edge region 92; bending region 921; driver chip 101; and flexible circuit board 102.

DESCRIPTION OF SPECIFIC EMBODIMENTS OF THE INVENTION

Examples are described below with reference to the appended drawings, to exemplify a particular embodiment of the invention each of the embodiments of the present embodiment. Directional terms mentioned in the present invention, such as "upper", "lower", "front", "rear", "left", "right", "inside", "outside", "side", etc., only reference to the accompanying drawings direction. Thus, the use of directional terms is used to describe and understand the present invention, not to limit the present invention. In the drawings, units of similar structure are using the same numeral to represent.

In the bending process of the prior art display panel, the inorganic film is brittle, cracks are easily generated, and the cracks may further propagate to the display region, thereby causing water and oxygen to intrude channels and damaging the device. The present invention can solve the above problems.

First Embodiment

A display panel, as shown in FIG. 1, includes an array substrate 10, a drain metal layer 20 disposed on the array substrate 10, a flat layer 30 disposed on the drain metal layer 20, and a pixel defining layer 50 and light-emitting device layer disposed on the flat layer 30.

The display panel includes a display region 91 and an edge region 92 located in the display region 91. The pixel defining layer 50 includes a first pixel defining layer 51 located in a display region 91 and a second pixel defining layer 52 located in an edge region 92 of a side portion of the display region 91.

A packaging layer 60 disposed on the first pixel defining layer 51. A bending region 921 is disposed in the edge region 92 of the display panel. A blocking structure is disposed on the second pixel defining layer 52 for blocking the packaging layer 60 from extending to the bending region 921.

Cracks are generated at the edge region of the packaging layer 60 during the bending process, even if the packaging layer 60 has extended to the bending region 921. Because of the blocking structure, the cracks of the packaging layer 60 have been stopped by the blocking structure. The cracks cannot propagate further into the display region 91, and it effectively blocks water and oxygen intrusion and prevents device damage.

In this embodiment, the array substrate includes a flexible substrate 11, an active semiconductor layer 12 disposed on the flexible substrate 11, a gate insulating layer 13 covering the active semiconductor layer 12, a gate metal layer 14 disposed on the gate insulating layer 13, an interlayer dielectric layer 15 covering the gate metal layer 14, and a drain metal layer 20 disposed on the interlayer dielectric layer 15.

Specifically, the light-emitting includes an anode metal layer 41 electrically connecting the drain metal layer 20, a light-emitting layer 42 disposed on the anode metal layer 41, and a cathode layer 43 disposed on the light-emitting layer 42.

Specifically, a groove 151 for facilitating bending of the display panel along the bending region 921 is disposed at a position corresponding to the bending region 921 on the interlayer dielectric layer 15. The groove 151 extends downward through the interlayer dielectric layer 15 and the gate insulating layer 13. The groove 151 is filled with an organic filling layer 80.

Specifically, the blocking structure includes a first blocking portion 71 disposed between the display region 91 and the bending region 921. The first blocking portion 71 contacts the packaging layer 60.

The first blocking portion prevents the packaging layer 60 from extending toward the bending region 921, thereby effectively blocking the intrusion of water and oxygen and preventing device damage.

Specifically, the first blocking portion 71 includes a blocking layer disposed on the pixel defining layer 50.

Specifically, a longitudinal section of the blocking layer is an inverted trapezoid shape. A height of the longitudinal section of the blocking layer is less than 1.5 microns.

Referring to FIG. 1, an angle between an upper line and a waist of the inverted trapezoid shape of the longitudinal section is "a", and the angle a is 120 to 170 degrees.

Material of the first blocking portion 71 is an organic material. The first blocking portion 71 is formed by a coating process. In an actual implementation, material of the first blocking portion 71 can be the same as or different from material of the pixel defining layer 50.

Figure 2:
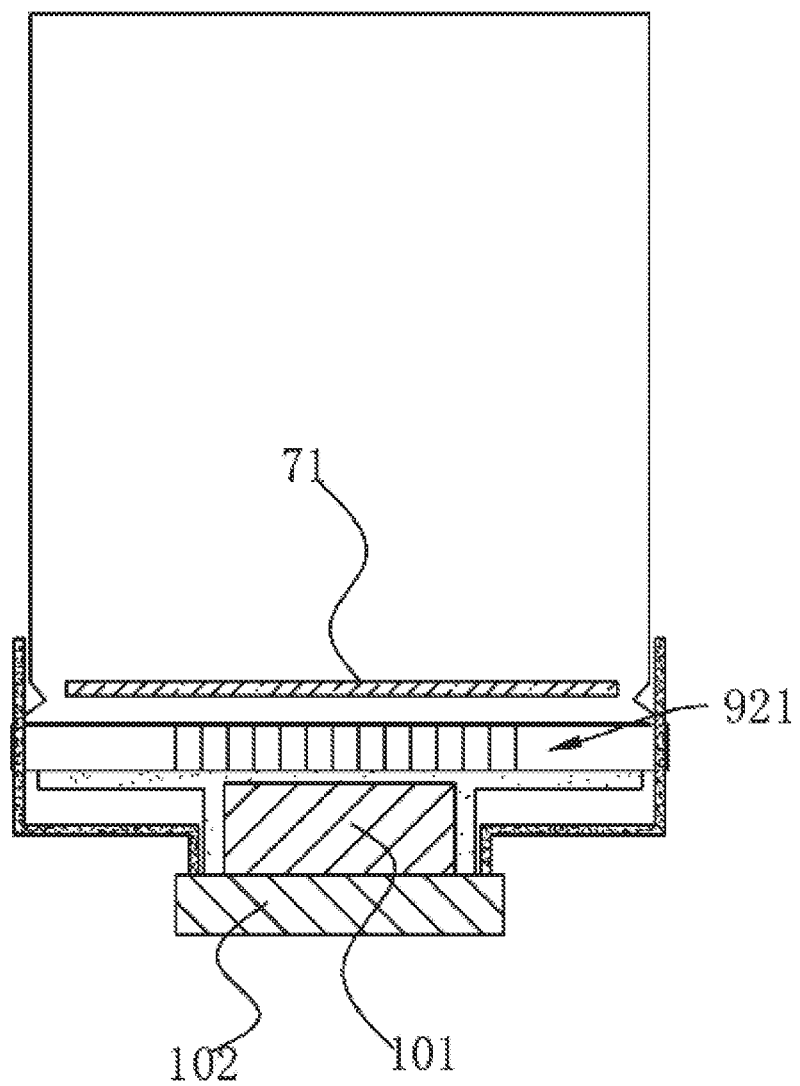
FIG. 2 is a cross-sectional view of a first blocking portion of one embodiment of the present invention.

Referring to FIG. 2, a whole cross section of the first blocking portion 71 is a strip shape. The first blocking portion 71 extends along a lengthwise direction of the bending region 921.

Further, a length of a side of the packaging layer 60 near a side of the first blocking portion 71 is less than or equal to a length of the first blocking portion 71. The first blocking portion 71 blocks the packaging layer 60, thereby preventing the packaging layer 60 direct contacts to the pixel defining layer 50 located in the bending region 921.

FIG. 2 only shows a case that the whole cross section of the first blocking portion 71 is a strip shape. In an actual implementation, the cross section of the first blocking portion 71 can also be a wave line or a curve line.

Figure 3:
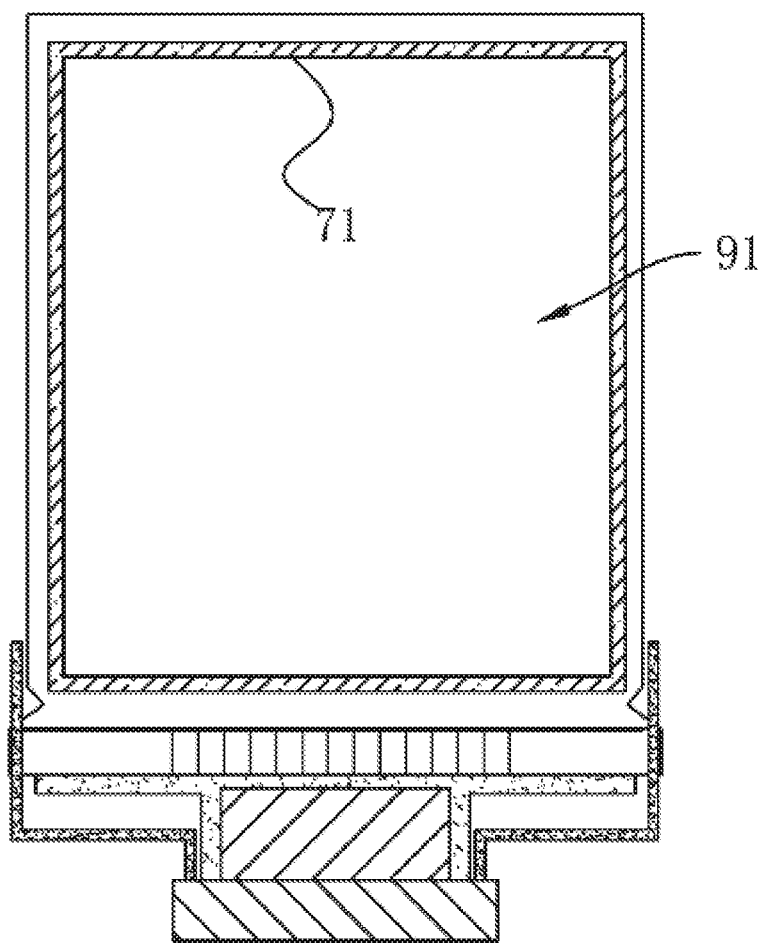
FIG. 3 is a cross-sectional view of the first blocking portion of the other embodiment of the present invention.

Referring to FIG. 3, in this embodiment, a whole cross section of the first blocking portion is a ring shape. The first blocking portion is disposed around a circumference of the display region.

Figure 4:
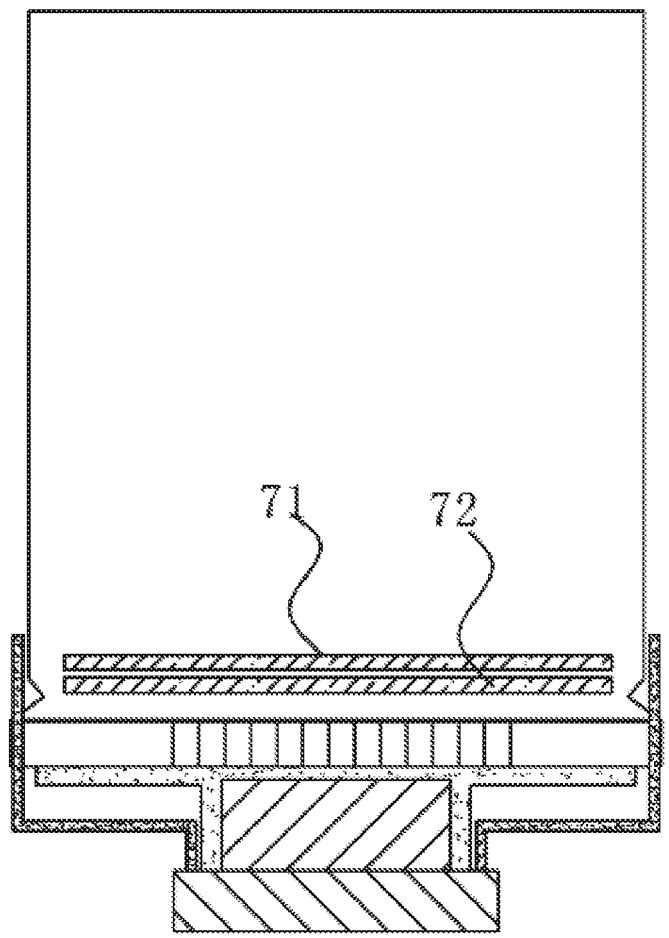
FIGS. 4 and 5 are structural diagrams of distribution of the first blocking portion and a second blocking portion of an embodiment of the present invention.
Figure 5:
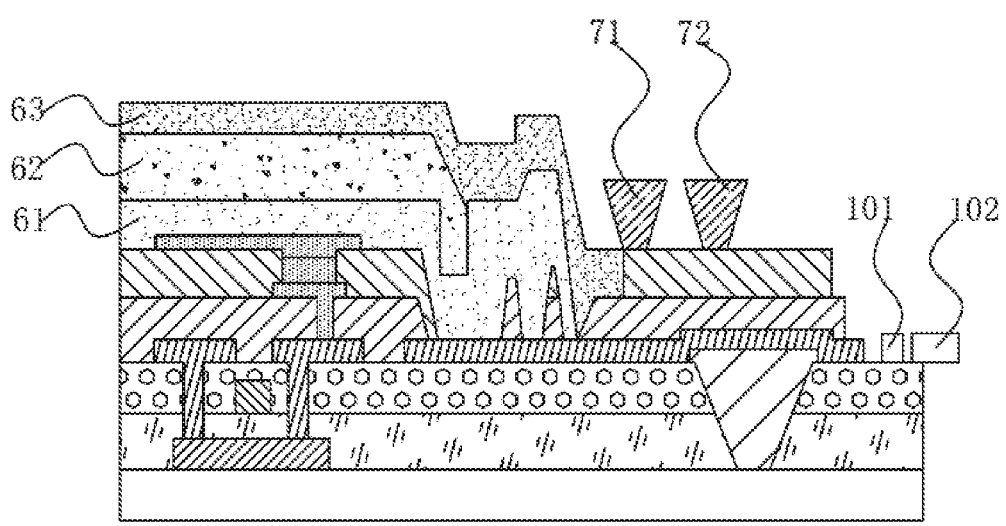

Referring to FIGS. 4 and 5, in this embodiment, the blocking structure further includes at least one second blocking portion 72 spaced with the first blocking portion 71. The at least one second blocking portion 72 is parallel to the first blocking portion 71.

Further, the second blocking portion 72 is located in a side of the first blocking portion 71 away from the packaging layer 60.

FIG. 4 only shows a case that the whole cross section of the first blocking portion 71 and the second blocking portion 72 is a strip shape. In an actual implementation, the cross section of the first blocking portion 71 and the second blocking portion 72 can also be a ring shape.

FIGS. 4 and 5 only show cases that the blocking structure includes a second blocking portion 72. In an actual implementation, the blocking structure includes two, three, or more second blocking portion 72 disposed away from the packaging layer 60 and spaced with the first blocking portion 71. Distance between neighboring two second blocking portion 72 can be the same or different.

Referring to FIG. 5, in this embodiment, the packaging layer 60 includes a first inorganic layer 61, an organic layer 62, a second inorganic layer 63 are sequentially laminated. The second inorganic layer 62 contacts the blocking layer.

A boundary of the second inorganic layer 62 is thinner. But an upper boundary of the inverted-trapezoid-shape blocking layer stops crack propagation and effectively blocks water and oxygen intrusion.

A thickness of the first inorganic layer 61 is 0.01-1 microns. The first inorganic layer 61 is formed on the pixel defining layer 50 by a plasma enhanced chemical vapor deposition method, a pulsed laser deposition method, or a surface treatment process. Preparation material of the first inorganic layer 61 includes but not limited to one or more of aluminum oxide, titanium oxide, silicon nitride, silicon oxide, and zirconium oxide.

The organic layer 62 is formed on the first inorganic layer 61 by an inkjet printing process. Preparation material of the organic layer 62 includes but not limited to one or more of hexamethyldisiloxane, acrylate, polyacrylate, polycarbonate, and polystyrene.

A thickness of the second inorganic layer 63 is 0.01-1 microns. The second inorganic layer 63 is formed on the pixel defining layer 50 by a plasma enhanced chemical vapor deposition method, a pulsed laser deposition method, or a surface treatment process. Preparation material of the second inorganic layer 63 includes but not limited to one or more of aluminum oxide, titanium oxide, silicon nitride, silicon oxide, and zirconium oxide.

In this embodiment shown as FIG. 5, the display panel further includes a driver chip 101 and a flexible circuit board 102 disposed on the array substrate 10. In the bending process, the driver chip 101 and the flexible circuit board 102 are bent along the bending region 921 to a back of the flexible substrate 11.

Figure 6:
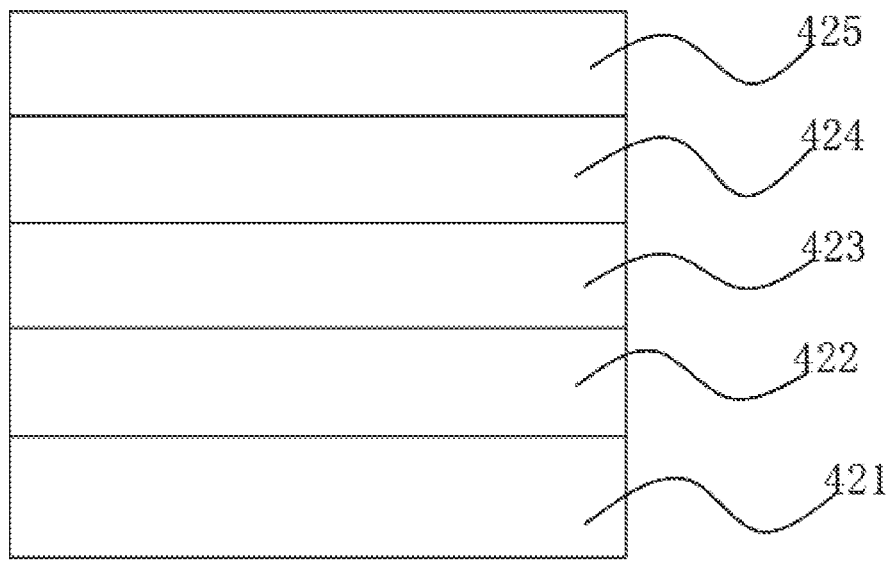
FIG. 6 is a structural diagram of a light-emitting device layer of an embodiment of the present invention.

Referring to FIG. 6, in this embodiment, the light-emitting layer 42 includes laminated a hole injection layer 421, a hole transport layer 422, a light-emitting material layer 423, an electron transport layer 424, and an electron injection layer 425.

Second Embodiment

Figure 7:
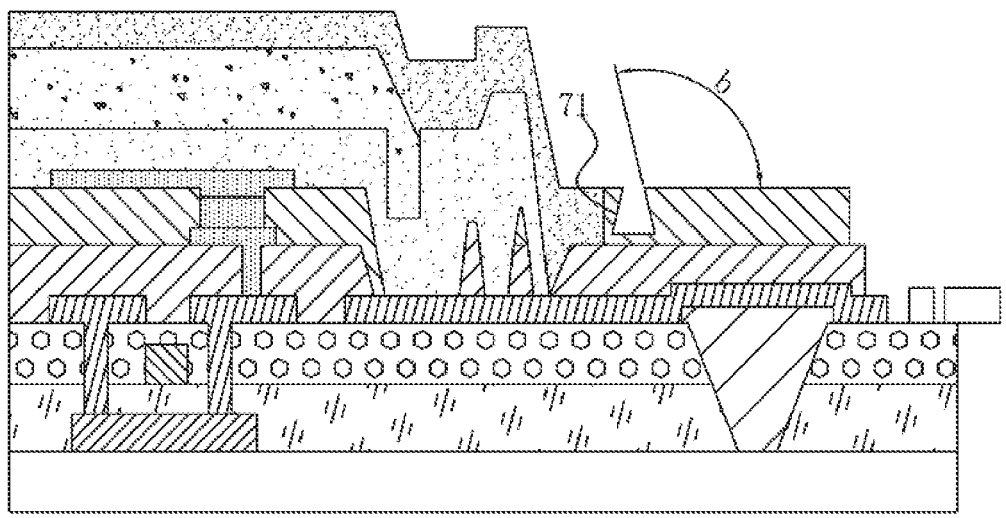
FIG. 7 is a structural diagram of a display panel of the second embodiment of the present invention.

A display panel, as shown in FIG. 7, only differs from the first embodiment in the shape of the blocking structure.

Specifically, the first blocking portion 71 includes a blocking groove disposed on the pixel defining layer 50.

Specifically, a longitudinal section of the blocking groove is a square shape or an isosceles trapezoid shape.

Referring to FIG. 7, an angle between a side of the blocking groove and a horizontal plane is "b", and the angle b is greater than 85 degrees.

Further, a depth of the blocking groove is less than or equal to a thickness of the pixel defining layer 50.

FIG. 7 only shows that the blocking structure includes a blocking groove. In an actual implementation, the blocking structure includes a plurality of blocking grooves disposed away from the packaging layer 60.

Cracks are generated at the edge region of the packaging layer 60 during the bending process, even if the packaging layer 60 has extended to the bending region 921. Because of an upper boundary of the first blocking portion 71, the cracks of the packaging layer 60 have been stopped by the blocking structure. The cracks cannot propagate further into the display region 91, and it effectively blocks water and oxygen intrusion and prevents device damage.

Although the present invention has been disclosed above by the preferred embodiments, the preferred embodiments are not intended to limit the invention. One of ordinary skill in the art, without departing from the spirit and scope of the present invention, can make various modifications and variations of the present invention. Therefore, the scope of the claims to define the scope of equivalents.

What is claimed is:

1. A display panel, comprising:
an array substrate;
a flat layer disposed on the array substrate;
a pixel defining layer disposed on the flat layer, the pixel defining layer comprising a first pixel defining layer located in a display region of the display panel, and a second pixel defining layer located in an edge region of a side portion of the display region; and a packaging layer disposed on the first pixel defining layer;

wherein a bending region is disposed in the edge region of the display panel;

wherein a blocking structure is disposed on the second pixel defining layer for blocking the packaging layer from extending to the bending region, the blocking structure comprises a first blocking portion disposed between the display region and the bending region, the first blocking portion contacts the packaging layer and extends along a lengthwise direction of the bending region, a whole cross section of the first blocking portion is a strip shape, and the first blocking portion comprises a blocking groove disposed on the pixel defining layer; and wherein the array substrate comprises:
  a flexible substrate;
  an active semiconductor layer disposed on the flexible substrate;
  a gate insulating layer covering the active semiconductor layer;
  a gate metal layer disposed on the gate insulating layer;
  an interlayer dielectric layer covering the gate metal layer; and
  a drain metal layer disposed on the interlayer dielectric layer, and the flat layer disposed on the drain metal layer.

2. The display panel as claimed in claim 1, wherein a length of a side of the packaging layer near a side of the first blocking portion is less than or equal to a length of the first blocking portion.

3. The display panel as claimed in claim 1, wherein a whole cross section of the first blocking portion is a ring shape, and the first blocking portion is disposed around a circumference of the display region.

4. The display panel as claimed in claim 1, wherein the first blocking portion comprises a blocking layer disposed on the pixel defining layer.

5. The display panel as claimed in claim 4, wherein a longitudinal section of the blocking layer is an inverted trapezoid shape.

6. The display panel as claimed in claim 1, wherein a longitudinal section of the blocking groove is a square shape or an isosceles trapezoid shape.

7. The display panel as claimed in claim 1, wherein the blocking structure further comprises at least one second blocking portion spaced with the first blocking portion, and the at least one second blocking portion is parallel to the first blocking portion.

8. A display panel, comprising:
an array substrate;
a flat layer disposed on the array substrate;
a pixel defining layer disposed on the flat layer, the pixel defining layer comprising a first pixel defining layer located in a display region of the display panel, and a second pixel defining layer located in an edge region of a side portion of the display region; and
a packaging layer disposed on the first pixel defining layer;

wherein a bending region is disposed in the edge region of the display panel; and wherein a blocking structure is disposed on the second pixel defining layer for blocking the packaging layer from extending to the bending region, the blocking structure comprises a first blocking portion disposed between the display region and the bending region, the first blocking portion contacts the packaging layer and extends along a lengthwise direction of the bending region, a whole cross section of the first blocking portion is a strip shape, and the first blocking portion comprises a blocking groove disposed on the pixel defining layer.

9. The display panel as claimed in claim 8, wherein a length of a side of the packaging layer near a side of the first blocking portion is less than or equal to a length of the first blocking portion.

10. The display panel as claimed in claim 8, wherein a whole cross section of the first blocking portion is a ring shape, and the first blocking portion is disposed around a circumference of the display region.

11. The display panel as claimed in claim 8, wherein the first blocking portion comprises a blocking layer disposed on the pixel defining layer.

12. The display panel as claimed in claim 11, wherein a longitudinal section of the blocking layer is an inverted trapezoid shape.

13. The display panel as claimed in claim 8, wherein a longitudinal section of the blocking groove is a square shape or an isosceles trapezoid shape.

14. The display panel as claimed in claim 8, wherein the blocking structure further comprises at least one second blocking portion spaced with the first blocking portion, and the at least one second blocking portion is parallel to the first blocking portion.

* * * * *